US008986785B2

(12) United States Patent
Wallace et al.

(10) Patent No.: US 8,986,785 B2
(45) Date of Patent: Mar. 24, 2015

(54) METHOD AND APPARATUS FOR CONTINUOUS SULFONIZATION OF DISCRETE ARTICLE

(75) Inventors: John Scripps Wallace, Bloomfield Village, MI (US); Bradlee Norman Radke, Roseville, MI (US)

(73) Assignee: Surface Activation Technologies, Troy, MI (US)

( * ) Notice: Subject to any disclaimer, the term of this patent is extended or adjusted under 35 U.S.C. 154(b) by 925 days.

(21) Appl. No.: 13/167,330

(22) Filed: Jun. 23, 2011

(65) Prior Publication Data
US 2012/0330054 A1 Dec. 27, 2012

(51) Int. Cl.
C23C 16/00 (2006.01)
B01J 8/08 (2006.01)

(52) U.S. Cl.
CPC .......................................... B01J 8/08 (2013.01)
USPC ....................................................... 427/255.5

(58) Field of Classification Search
None
See application file for complete search history.

(56) References Cited

U.S. PATENT DOCUMENTS

| 2,367,149 A | 1/1945 | Smith |
| 2,665,659 A | 1/1954 | Ogle, Jr. |
| 2,832,697 A | 4/1958 | Walles |
| 2,955,252 A | 10/1960 | Williams |
| 3,607,087 A | 9/1971 | Graham |
| 3,613,957 A | 10/1971 | Walles |
| 3,629,025 A | 12/1971 | Walles |
| 3,684,554 A | 8/1972 | Donald et al. |
| 3,685,446 A | 8/1972 | Walles et al. |
| 3,689,810 A | 9/1972 | Walles |
| 3,705,041 A | 12/1972 | Walles et al. |
| 3,725,109 A | 4/1973 | Schulz et al. |
| 3,740,258 A | 6/1973 | Walles |
| 3,770,706 A | 11/1973 | Walles |
| 3,779,840 A | 12/1973 | Walles |
| 3,824,762 A | 7/1974 | Walles |
| 3,828,960 A | 8/1974 | Walles |
| 3,856,172 A | 12/1974 | Walles |
| 3,911,184 A | 10/1975 | Caskey et al. |
| 3,916,048 A | 10/1975 | Walles |
| 3,921,844 A | 11/1975 | Walles |
| 3,947,539 A | 3/1976 | Lane |

(Continued)

FOREIGN PATENT DOCUMENTS

| BE | 1010620 | 11/1998 |
| EP | 0356966 | 3/1990 |

(Continued)

*Primary Examiner* — Karl J Puttlitz
(74) *Attorney, Agent, or Firm* — Howard & Howard Attorneys PLLC

(57) ABSTRACT

An apparatus for continuous sulfonization of discrete articles comprising a feeder box for drying the discrete articles with ultra-dry air, a sulfonization chamber for treating the discrete articles with sulfur trioxide gas, a conveyor assembly for transporting the discrete articles from the feeder box to the sulfonization chamber, and a neutralizing tank for treating the discrete articles with neutralizing fluid. The sulfonization chamber includes a rotating dial plate with a circular periphery and an upper surface extending radially from and rotatable about a center axis (A) for receiving the discrete articles at the circular periphery. A plurality of arcuate guides extend perpendicularly from a guide arm toward the rotating dial plate and are spaced radially outward from one another along a radial (R) extending radially from the center axis (A) for moving the discrete articles radially inward in a spiral path during rotation of the rotating dial plate.

10 Claims, 4 Drawing Sheets

(56) References Cited

U.S. PATENT DOCUMENTS

| | | |
|---|---|---|
| 3,959,561 A | 5/1976 | Walles |
| 3,993,811 A | 11/1976 | Walles |
| 3,996,725 A | 12/1976 | Walles |
| 4,105,841 A | 8/1978 | Settineri et al. |
| 4,157,432 A | 6/1979 | Lundberg et al. |
| 4,220,739 A | 9/1980 | Walles |
| 4,335,079 A | 6/1982 | Vander Mey |
| 4,457,977 A | 7/1984 | Walles |
| 4,518,681 A | 5/1985 | Johnson et al. |
| 4,615,914 A | 10/1986 | Walles |
| 4,665,956 A | 5/1987 | Freeman |
| 4,745,015 A | 5/1988 | Cheng et al. |
| 4,759,814 A | 7/1988 | Katz |
| 4,775,587 A | 10/1988 | Walles |
| 4,861,250 A | 8/1989 | Walles et al. |
| 4,902,493 A | 2/1990 | Walles et al. |
| 4,915,912 A | 4/1990 | Walles et al. |
| 5,030,399 A | 7/1991 | Walles et al. |
| 5,156,783 A | 10/1992 | Seizert et al. |
| 5,202,161 A | 4/1993 | Seizert et al. |
| 5,229,077 A | 7/1993 | Bell et al. |
| 5,233,081 A | 8/1993 | Walles |
| 5,261,764 A | 11/1993 | Walles |
| 5,308,587 A | 5/1994 | Cameron |
| 5,374,314 A | 12/1994 | Babacz |
| 5,565,248 A | 10/1996 | Plester et al. |
| 5,567,491 A | 10/1996 | Vezzoli et al. |
| 5,605,718 A | 2/1997 | Tinant et al. |
| 5,677,010 A | 10/1997 | Esser et al. |
| 5,679,412 A | 10/1997 | Kuehnle et al. |
| 5,779,954 A | 7/1998 | Tinant et al. |
| 5,849,818 A | 12/1998 | Walles et al. |
| 6,276,296 B1 | 8/2001 | Plester |
| 6,474,919 B2 | 11/2002 | Wallace et al. |
| 6,572,835 B1 | 6/2003 | MacArthur et al. |
| 6,691,726 B2 | 2/2004 | Erdei et al. |
| 6,719,848 B2 * | 4/2004 | Faykosh et al. ............... 118/718 |
| 6,758,910 B2 * | 7/2004 | Schmoyer .................... 118/715 |
| 6,895,983 B2 | 5/2005 | Chittenden |
| 7,578,953 B2 | 8/2009 | Winter et al. |
| 2003/0033676 A1 | 2/2003 | DeYoung et al. |
| 2003/0091741 A1 | 5/2003 | Schmoyer |
| 2004/0043625 A1 | 3/2004 | Vaartstra et al. |
| 2005/0087135 A1 | 4/2005 | Hioki et al. |
| 2006/0217903 A1 | 9/2006 | Shajii et al. |
| 2009/0117272 A1 | 5/2009 | Behres |

FOREIGN PATENT DOCUMENTS

| | | |
|---|---|---|
| EP | 0695779 | 2/1996 |
| JP | 3868260 B2 | 1/2007 |

* cited by examiner

METHOD AND APPARATUS FOR CONTINUOUS SULFONIZATION OF DISCRETE ARTICLE

BACKGROUND OF THE INVENTION

1. Field of the Invention

An apparatus for continuous sulfonization of discrete articles using ultra-dry air, sulfur trioxide gas, and a neutralizing fluid.

2. Description of the Prior Art

The sulfonization apparatuses of the type to which the subject invention pertains continuously treat the surfaces of discrete articles with ultra-dry air, sulfur trioxide gas, and neutralizing fluid. One such apparatus is illustrated in U.S. Pat. No. 6,719,848 to Faykosh et al. wherein the apparatus treats glass sheet substrates with a chemical vapor as they move along a straight conveyor. This apparatus has a chamber bottom with a circular periphery extending about a center axis and defines a chamber bottom opening on the center axis. Another such apparatus is illustrated in U.S. Pat. No. 6,758,910 to Schmoyer wherein dry air and sulfur trioxide gas are mixed to treat discrete articles in a sulfonization apparatus. This apparatus also includes a chamber bottom with a circular periphery extending about a center axis and defines a chamber bottom opening on the center axis for loading and unloading the discrete articles onto a rack inside the sulfonization apparatus for batch treatment of the articles. In addition, the Schmoyer patent shows the feature of employing a neutralizing fluid to the discrete articles after the ultra-dry air and sulfur trioxide gas treatments are employed.

These prior-art sulfonization apparatuses use either straight line conveyors or treatment of discrete articles in separate batches. The straight line conveyor may need to be very long or move at a very slow speed to allow sufficient treatment time for the articles on the conveyor. Using a batch treatment process requires loading and unloading of discrete articles into an apparatus of restricted size and also requires a fixed period of time to treat each batch of discrete articles. Neither method allows an efficient use of both time and space in continuous treatment of discrete articles with sulfur trioxide gas.

SUMMARY OF THE INVENTION

The subject invention provides such a sulfonization apparatus wherein the sulfonization chamber includes a rotating dial plate with a circular periphery and an upper surface extending radially from and rotatable about a center axis for receiving the discrete articles at the circular periphery of the rotating dial plate.

The invention also provides a method for continuous sulfonization of discrete articles characterized by the steps of transferring the discrete articles one at a time in a continuous stream from the feeder box to the outer periphery of the sulfonization chamber, rotating the discrete articles a predetermined number of revolutions per minute about a center axis (A) of the sulfonization chamber, moving the rotating discrete articles radially inward from the outer periphery of the sulfonization chamber in a spiral path toward the center axis of the sulfonization chamber, treating the discrete articles with the sulfur trioxide gas as the discrete articles move in the spiral path, and transporting the discrete articles at the center axis through a chamber bottom opening at the center axis to the neutralizing tank.

Advantages of the Invention

The subject invention provides for both time and space efficient continuous treatment of discrete articles with ultra-dry air, sulfur trioxide gas, and neutralizing fluid. Using a rotating dial plate for movement of the discrete articles within the sulfonization chamber combines several advantages in the prior art while eliminating disadvantages. Using a rotating dial which moves the discrete articles inwardly toward a central axis along a spiral path allows for continuous treatment of the discrete articles without the need for a long conveyor or a short conveyor moving at slow, inefficient speeds. Use of the rotating dial plate to move the discrete articles also allows the sulfonization apparatus to use less space than would be needed by a straight conveyor. Additionally, the rotating dial plate allows the use of a small space similar to a batch-process apparatus while avoiding the delays in loading and unloading batches and the restriction of processing only one batch at a time.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE ENABLING EMBODIMENTS

Figure 1:
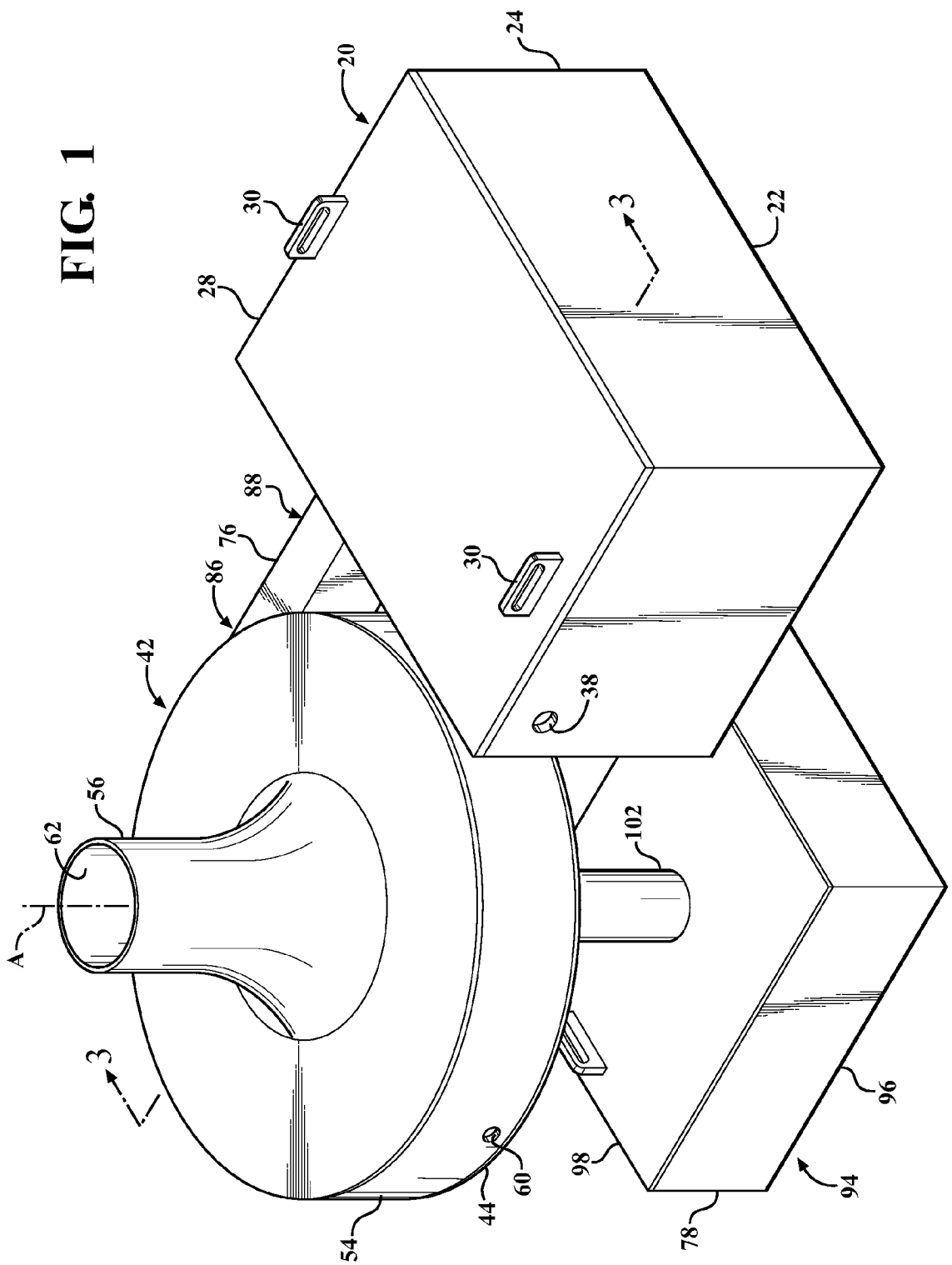
FIG. 1 is a front elevation view showing the sulfonization apparatus of the subject invention.
Figure 2:
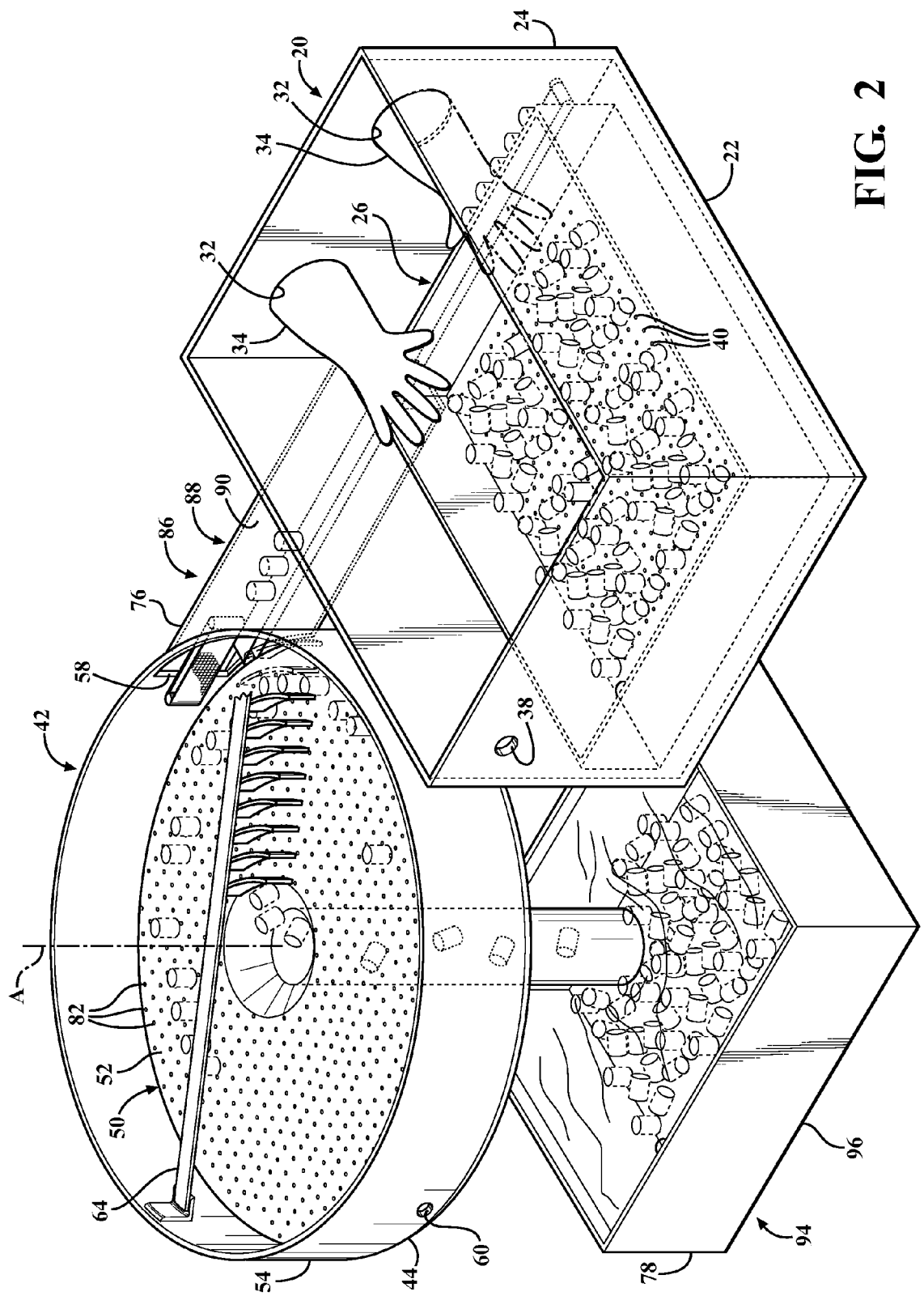
FIG. 2 is a front elevation view showing the sulfonization apparatus of the subject invention with each top removed.
Figure 3:
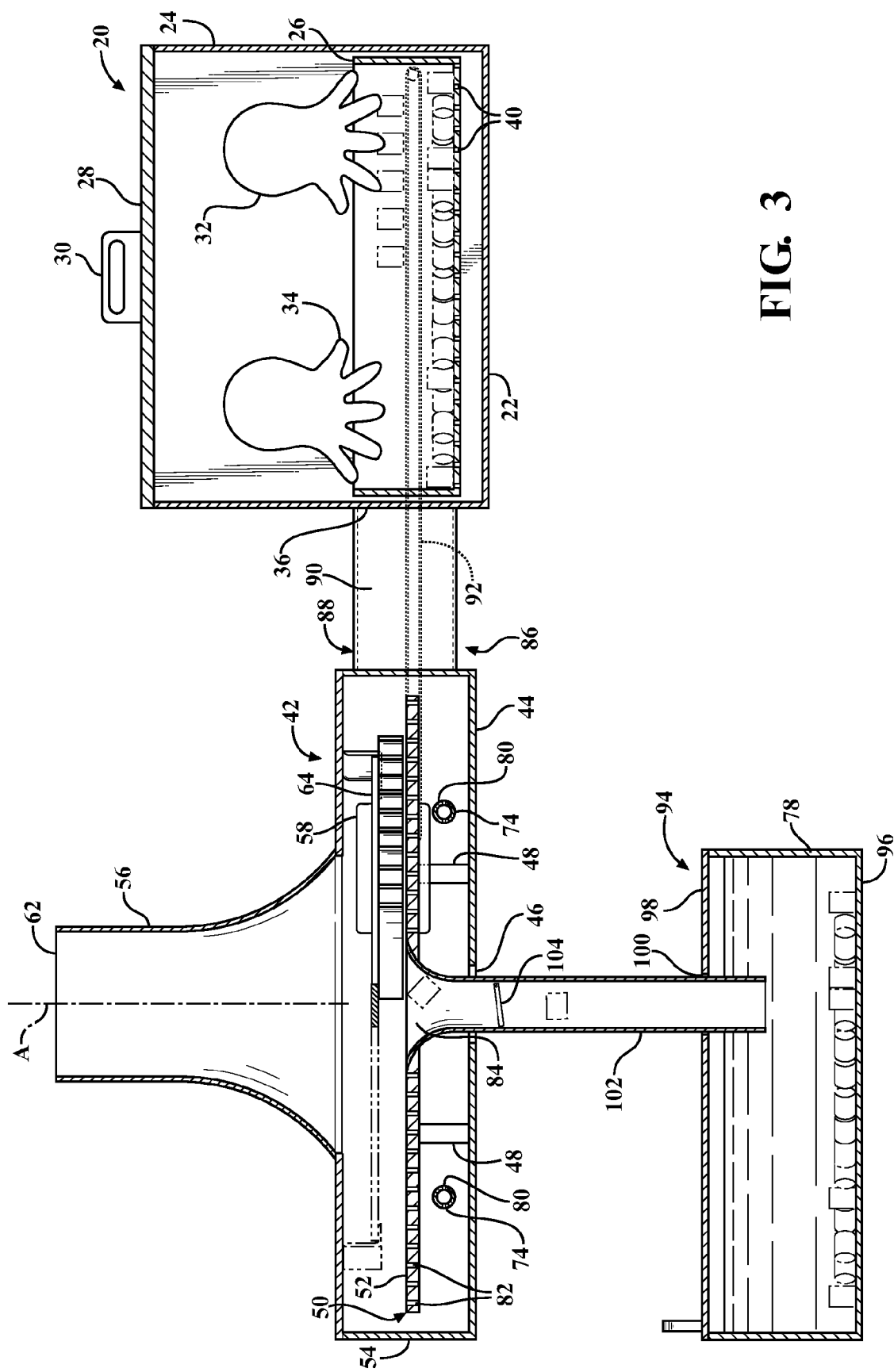
FIG. 3 is a cross-sectional view of FIG. 1 through section B-B.
Figure 4:
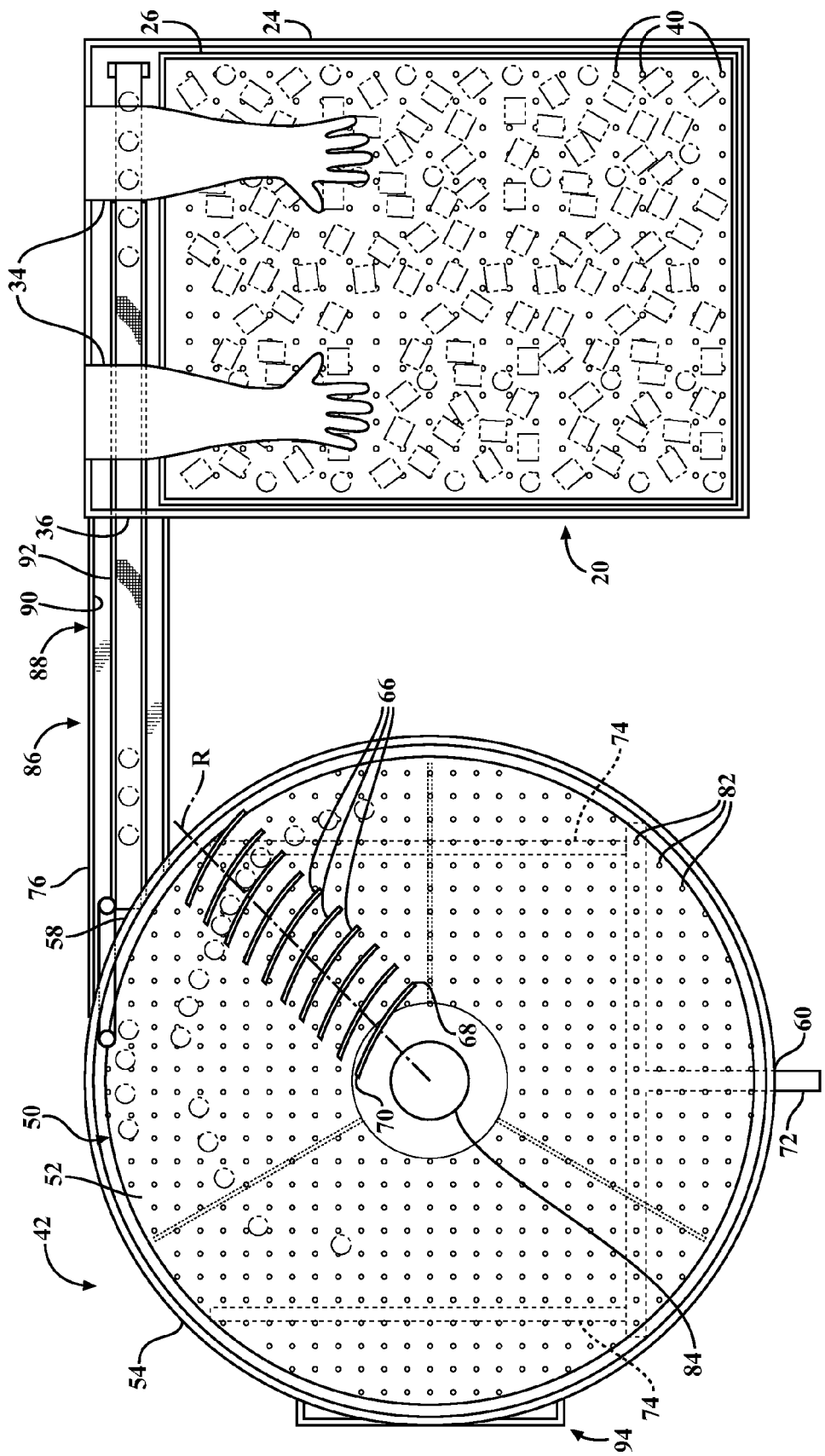
FIG. 4 is a top view of FIG. 2.

Referring to the Figures, wherein like numerals indicate corresponding parts throughout the several views, an apparatus for continuous sulfonization of discrete articles using ultra-dry air, sulfur trioxide gas, and a neutralizing fluid constructed in accordance with the subject invention is shown in FIGS. 1, 2, 3, and 4.

The sulfonization apparatus includes a feeder box 20, generally indicated, for drying the discrete articles with ultra-dry air. The feeder box 20 is constructed from a box bottom 22 having a rectangular periphery and a plurality of box sides 24 extending upwardly about the rectangular periphery and perpendicular to the box bottom 22 to define an open top. The feeder box 20 includes a box liner 26 extending parallel to the box bottom 22 and upwardly along a portion of the box sides 24 for providing a cushion to the discrete articles within the feeder box 20. The feeder box 20 also includes a box top 28 perpendicular to the box sides 24 and parallel to the box bottom 22 for closing the open top defined by the box sides 24. The box top 28 includes a pair of handles 30 for facilitating manual removal of the box top 28 from the feeder box 20 allowing an operator to load the discrete articles into the feeder box 20.

A first of the box sides 24 defines a plurality of access openings 32 for allowing access to the discrete articles. A plurality of covers 34 having a glove-like shape are disposed on the first box side 24 and about the access openings 32 for allowing manual access to the discrete articles within the feeder box 20. An operator can use the glove-like covers 34 to manipulate the discrete articles in the feeder box 20 without negatively impacting the drying process. A second of the box sides 24 defines an exit opening 36 for allowing transfer of the discrete articles from the feeder box 20 after they complete the drying process. The second box side 24 extends perpendicularly from the first box side 24 in the preferred embodiment.

One of the box sides 24 of the feeder box 20 also defines an air inlet opening 38 for introducing the ultra-dry air into the feeder box 20. The box bottom 22 defines a plurality of box perforations 40 for circulating the ultra-dry air through the box bottom 22 and out of the feeder box 20. The ultra-dry air enters the feeder box 20 through the air inlet opening 38 and exits the box through the box perforations 40 in the box bottom 22.

The sulfonization apparatus also includes a sulfonization chamber 42, generally indicated, for treating the discrete articles with sulfur trioxide gas. The sulfonization chamber 42 includes a chamber bottom 44 having a circular periphery extending about a center axis A and defines a chamber bottom opening 46 on the center axis A for transferring the discrete articles out of the sulfonization chamber 42. In the preferred embodiment, the sulfonization chamber 42 is constructed of stainless steel, inconel, fluoropolymer-based material, or any other material resistant to extreme acidity.

The sulfonization chamber 42 includes a dial mount 48 disposed upon the chamber bottom 44 and extending about and radially spaced from the chamber bottom opening 46. The sulfonization chamber 42 also includes a rotating dial plate 50 having a circular periphery rotatably supported on the dial mount 48 about the center axis A and extending parallel to and spaced from the chamber bottom 44. The rotating dial plate 50 presents an upper surface 52 extending radially from the center axis A and disposed above the chamber bottom 44 for receiving the discrete articles at the circular periphery of the rotating dial plate 50. In the preferred embodiment, the rotating dial plate 50 is also constructed of stainless steel, inconel, fluoropolymer-based material, or any other material resistant to extreme acidity.

The sulfonization chamber 42 also includes a chamber wall 54 and a chamber top 56 supported on the chamber wall 54. The chamber wall 54 has a cylindrical shape extending upwardly about the circular periphery of the chamber bottom 44 and perpendicular to the chamber bottom 44. The chamber wall 54 defines an entrance opening 58 for allowing transfer of the discrete articles into the sulfonization chamber 42 and onto the upper surface 52 of the rotating dial plate 50. The chamber wall 54 also defines a gas inlet opening 60 for allowing sulfur trioxide gas into the sulfonization chamber 42 to treat the discrete articles. The chamber top 56 is frustoconical in shape about the center axis A and defines an exhaust opening 62 on the center axis A for exhausting the sulfur trioxide gas.

The chamber wall 54 includes a guide arm 64 extending parallel to and spaced from the upper surface 52 of the rotating dial plate 50. The guide arm 64 includes a plurality of guides 66 being arcuate in shape and extending perpendicularly from the guide arm 64 toward the upper surface 52 of the rotating dial plate 50 and spaced radially outward from one another along a radial R extending radially from the center axis A for moving the discrete articles radially inward in a spiral path during rotation of the rotating dial plate 50. In the preferred embodiment, the rotating dial plate 50 will travel between one half and one revolution per minute to slowly move the discrete articles along the spiral path while they are treated with the sulfur trioxide gas.

A first of the guides 66 includes a first end 68 for receiving the discrete articles and extends in a spiral about the center axis A to a second end 70 for positioning the discrete articles radially inward for alignment with the first end 68 of a next of the guides 66 spaced radially inward from the first of the guides 66 for moving the discrete articles progressively and radially inward in response to successive rotations of the rotating dial plate 50. In other words, the spacing and shape of the guides 66 allow the discrete articles to move successively inward in a spiral path through each of the guides 66 on the upper surface 52 of the rotating dial plate 50.

The sulfonization chamber 42 also includes a gas inlet tube 72 with a pair of tube legs 74 disposed on opposite sides of the gas inlet opening 60 and between the chamber bottom 44 and the rotating dial plate 50 and spaced apart from the center axis A for distributing the sulfur trioxide gas into the sulfonization chamber 42. The gas inlet tube 72 defines tube perforations 80 for distributed introduction of the sulfur trioxide gas into the sulfonization chamber 42 below the rotating dial plate 50. The rotating dial plate 50 also defines a plurality of dial perforations 82 for circulating the sulfur trioxide gas through the rotating dial plate 50 and into the sulfonization chamber 42. In other words, the preferred embodiment has the sulfur trioxide gas entering the sulfonization chamber 42 through the tube perforations 80 and traveling upwardly through the dial perforations 82 to treat the discrete articles on the rotating dial plate 50 before exiting the sulfonization chamber 42 through the exhaust opening 62.

The rotating dial plate 50 defines a dial opening 84 about the center axis A spaced axially from the chamber bottom opening 46 for transferring the discrete articles from the rotating dial plate 50 after the discrete articles reach the dial opening 84. The diameter and speed of the rotating dial plate 50 defines the length of time the discrete articles are treated in the sulfonization chamber 42 with the sulfur trioxide gas.

The sulfonization apparatus also includes a conveyor assembly 86, generally indicated, extending between the feeder box 20 and the sulfonization chamber 42 for transporting the discrete articles from the feeder box 20 to the sulfonization chamber 42. The conveyor assembly 86 includes a conveyor housing 88 comprised of a plurality of housing sides 76 defining an interior channel 90 extending between the exit opening 36 of the feeder box 20 and tangentially to the entrance opening 58 of the sulfonization chamber 42.

The conveyor assembly 86 also includes a conveyor 92 extending from a third box side 24 opposite the second box side 24 and adjacent the first box side 24 through the exit opening 36 and the conveyor housing 88 to the entrance opening 58 of the sulfonization chamber 42 for transporting the discrete articles from the feeder box 20 to the sulfonization chamber 42. Manual loading of the discrete articles onto the conveyor is completed inside the feeder box 20 to avoid contamination of the discrete articles after they are dried with ultra-dry air.

The sulfonization apparatus also includes a neutralizing tank 94, generally indicated, for receiving the discrete articles from the sulfonization chamber 42 and for treating the discrete articles with neutralizing fluid. The neutralizing tank 94 includes a tank bottom 96 having a rectangular periphery and a plurality of tank sides 78 extending upwardly about the periphery and perpendicular to the tank bottom 96 for holding the neutralizing fluid. A tank top 98 is supported by the tank sides 78 perpendicular to the tank sides 78 and parallel to the tank bottom 96. The tank top 98 defines a tank opening 100 for receiving the discrete articles from the sulfonization chamber 42.

The sulfonization apparatus also includes an exit tube 102 extending between the sulfonization chamber 42 and the neutralizing tank 94 for transporting the discrete articles from the sulfonization chamber 42 to the neutralizing tank 94. The exit tube 102 has a cylindrical shape and extends from the dial opening 84 through the chamber bottom opening 46 and the tank opening 100 to the neutralizing tank 94 for guiding gravitational movement of the discrete articles from the rotating dial plate 50 and into the neutralizing tank 94 after the discrete articles complete the spiral path on the upper surface 52 of the rotating dial plate 50. The exit tube 102 includes a trap door 104 disposed within the exit tube 102 parallel to the tank bottom 96 for closing the exit tube 102 and containing the neutralizing fluid within the neutralizing tank 94.

As alluded to above, the subject invention also includes a method for continuous sulfonization of discrete articles including drying the discrete articles with ultra-dry air in a feeder box 20, treating the discrete articles with sulfur trioxide gas in a sulfonization chamber 42, and treating the discrete articles with neutralizing fluid in a neutralizing tank 94.

The sulfonization process begins by loading the discrete articles into the feeder box 20 and feeding the ultra-dry air into the feeder box 20 to dry the discrete articles. Once dry, the discrete articles are transferred one at a time in a continuous stream from the feeder box 20 to the outer periphery of the sulfonization chamber 42. The loading and transferring of discrete articles can be done manually by operators, automatically by machines, or using a combination of manual and automatic steps.

In the sulfonization chamber 42, the discrete articles are rotated a pre-determined number of revolutions per minute about a center axis A of the sulfonization chamber 42. In the preferred embodiment, the discrete articles move between one-half and one revolution per minute. The rotation of the discrete articles is further defined by placing the discrete articles on a rotating dial plate 50 having a circular periphery and presenting an upper surface 52 and disposed in the sulfonization chamber 42 for carrying the discrete articles.

While the discrete articles rotate about the center axis A on the rotating dial plate 50, they are moved radially inward from the outer periphery of the sulfonization chamber 42 in a spiral path toward the center axis A of the sulfonization chamber 42. The movement of the rotating discrete articles radially inward is further defined by using a plurality of arcuate guides 66 extending perpendicularly from the upper surface 52 and spaced radially outward from one another along a radial R extending radially from the center axis A of the sulfonization chamber 42. In other words, each of the plurality of guides 66 moves the discrete articles radially inward toward the center axis A on the upper surface 52 of the rotating dial plate 50.

During movement along the spiral path, the discrete articles are treated with the sulfur trioxide gas. Once the discrete articles reach the center axis A, the discrete articles are transported through a chamber bottom opening 46 at the center axis A to a neutralizing tank 94. The discrete articles are treated with the neutralizing fluid in the neutralizing tank 94. After the neutralizing treatment, the discrete articles are removed from the neutralizing tank 94 to complete the sulfonization process.

Obviously, many modifications and variations of the present invention are possible in light of the above teachings and may be practiced otherwise than as specifically described while within the scope of the appended claims. That which is prior art in the claims precedes the novelty set forth in the "characterized by" clause. The novelty is meant to be particularly and distinctly recited in the "characterized by" clause whereas the antecedent recitations merely set forth the old and well-known combination in which the invention resides. These antecedent recitations should be interpreted to cover any combination in which the inventive novelty exercises its utility. The use of the word "said" in the apparatus claims refers to an antecedent that is a positive recitation meant to be included in the coverage of the claims whereas the word "the" precedes a word not meant to be included in the coverage of the claims. In addition, the reference numerals in the claims are merely for convenience and are not to be read in any way as limiting.

What is claimed is:

1. A method for continuous sulfonization of discrete articles including a feeder box for drying the discrete articles with ultra-dry air, a sulfonization chamber for treating the discrete articles with sulfur trioxide gas, and a neutralizing tank for treating the discrete articles with neutralizing fluid comprising the steps of:
   transferring the discrete articles one at a time in a continuous stream from the feeder box to the outer periphery of the sulfonization chamber,
   rotating the discrete articles a pre-determined number of revolutions per minute about a center axis of the sulfonization chamber,
   moving the rotating discrete articles radially inward from the outer periphery of the sulfonization chamber in a spiral path toward the center axis of the sulfonization chamber,
   treating the discrete articles with the sulfur trioxide gas as the discrete articles move in the spiral path, and
   transporting the discrete articles at the center axis through a chamber bottom opening at the center axis to the neutralizing tank.

2. A method as set forth in claim 1 wherein said rotating the discrete articles is further defined by placing the discrete articles on a rotating dial plate having a circular periphery and presenting an upper surface and disposed in the sulfonization chamber.

3. A method as set forth in claim 1 wherein said moving the rotating discrete articles radially inward is further defined by using a plurality of arcuate guides extending perpendicularly from a guide arm toward the upper surface of the rotating dial plate and spaced radially outward from one another along an axis extending radially from the center axis of the sulfonization chamber.

4. A method as set forth in claim 1 including
   loading the discrete articles into the feeder box.

5. A method as set forth in claim 4 including
   feeding the ultra-dry air into the feeder box for drying the discrete articles.

6. A method as set forth in claim 1 including
   treating the discrete articles with the neutralizing fluid in the neutralizing tank.

7. A method as set forth in claim 6 including
   removing the discrete articles from the neutralizing tank.

8. A method for continuous sulfonization of discrete articles including a feeder box for drying the discrete articles with ultra-dry air, a sulfonization chamber for treating the discrete articles with sulfur trioxide gas, and a neutralizing tank for treating the discrete articles with neutralizing fluid comprising the steps of:
   loading the discrete articles into the feeder box,
   feeding the ultra-dry air into the feeder box for drying the discrete articles,
   transferring the discrete articles one at a time in a continuous stream from the feeder box to the outer periphery of the sulfonization chamber,
   rotating the discrete articles a pre-determined number of revolutions per minute about a center axis of the sulfonization chamber,
   moving the rotating discrete articles radially inward from the outer periphery of the sulfonization chamber in a spiral path toward the center axis of the sulfonization chamber, treating the discrete articles with the sulfur trioxide gas as the discrete articles move in the spiral path, transporting the discrete articles at the center axis through a chamber bottom opening at the center axis to the neutralizing tank, treating the discrete articles with the neutralizing fluid in the neutralizing tank, and removing the discrete articles from the neutralizing tank.

9. A method as set forth in claim 8 wherein said rotating the discrete articles is further defined by placing the discrete articles on a rotating dial plate having a circular periphery and presenting an upper surface and disposed in the sulfonization chamber.

10. A method as set forth in claim 9 wherein said moving the rotating discrete articles radially inward is further defined by using a plurality of arcuate guides extending perpendicularly from a guide arm toward the upper surface of the rotating dial plate and spaced radially outward from one another along an axis extending radially from the center axis (A) of the sulfonization chamber.

* * * * *